(12) United States Patent
Umeda et al.

(10) Patent No.: US 11,191,198 B2
(45) Date of Patent: Nov. 30, 2021

(54) SHIELD PACKAGE

(71) Applicant: TATSUTA ELECTRIC WIRE & CABLE CO., LTD., Higashiosaka (JP)

(72) Inventors: Hiroaki Umeda, Kizugawa (JP); Kazuhiro Matsuda, Kizugawa (JP); Hajime Nakazono, Kizugawa (JP); Hidetoshi Noguchi, Kizugawa (JP)

(73) Assignee: TATSUTA ELECTRIC WIRE & CABLE CO., LTD., Higashiosaka (JP)

( * ) Notice: Subject to any disclaimer, the term of this patent is extended or adjusted under 35 U.S.C. 154(b) by 3 days.

(21) Appl. No.: 16/753,864

(22) PCT Filed: Sep. 27, 2018

(86) PCT No.: PCT/JP2018/035969
§ 371 (c)(1),
(2) Date: Apr. 6, 2020

(87) PCT Pub. No.: WO2019/073809
PCT Pub. Date: Apr. 18, 2019

(65) Prior Publication Data
US 2020/0288608 A1 Sep. 10, 2020

(30) Foreign Application Priority Data

Oct. 13, 2017 (JP) .............................. JP2017-199826

(51) Int. Cl.
*H05K 9/00* (2006.01)
*C09D 7/61* (2018.01)
(Continued)

(52) U.S. Cl.
CPC ............. *H05K 9/0083* (2013.01); *C09D 5/24* (2013.01); *C09D 7/61* (2018.01); *C09D 163/00* (2013.01);
(Continued)

(58) Field of Classification Search
CPC ........ H05K 1/02; H05K 1/203; H05K 1/0209; H05K 1/0216; H05K 1/11; H05K 1/14;
(Continued)

(56) References Cited

U.S. PATENT DOCUMENTS

| 5,639,989 A * | 6/1997 | Higgins, III ........... H05K 3/284 174/386 |
| 6,717,485 B2 * | 4/2004 | Kolb ...................... H04B 15/02 174/250 |

(Continued)

FOREIGN PATENT DOCUMENTS

| JP | 2003-258137 A | 9/2003 |
| JP | 2005-294254 A | 10/2005 |

(Continued)

OTHER PUBLICATIONS

International Search Report dated Dec. 18, 2018, issued in counterpart International Application No. PCT/JP2018/035969 (1 page).

*Primary Examiner* — Tuan T Dinh
(74) *Attorney, Agent, or Firm* — Westerman, Hattori, Daniels & Adrian, LLP (57) ABSTRACT

A shield package is disclosed including: a package in which an electronic component is mounted on a substrate, the electronic component being sealed with sealing material; and a shield layer including a first layer and a second layer that are sequentially laminated on the package, in which the first layer made from a conductive resin composition having 100 parts by mass of a binder component, 400 parts by mass to 1800 parts by mass of metal particles, and 0.3 part by mass to 40 parts by mass of a curing agent, the metal particles include at least spherical metal particles and flaky metal particles, and the second layer made from a conductive resin composition containing a binder component, metal particles having an average particle diameter of 10 nm to (Continued)

500 nm, metal particles having an average particle diameter of 1 μm to 50 μm, and a radical polymerization initiator.

7 Claims, 3 Drawing Sheets

(51) Int. Cl.
| | | |
|---|---|---|
| *C09D 5/24* | (2006.01) | |
| *C09D 163/00* | (2006.01) | |
| *H01L 21/56* | (2006.01) | |
| *H01L 23/29* | (2006.01) | |
| *H01L 23/31* | (2006.01) | |
| *H01L 23/552* | (2006.01) | |
| *H05K 5/06* | (2006.01) | |

(52) U.S. Cl.
CPC .......... *H01L 21/561* (2013.01); *H01L 23/295* (2013.01); *H01L 23/3121* (2013.01); *H01L 23/552* (2013.01); *H05K 5/065* (2013.01)

(58) Field of Classification Search
CPC ............ H05K 1/18; H05K 9/00; H05K 9/003; H05K 9/0081; H05K 9/0087; H01L 21/56; H01L 21/78; H01L 23/00; H01L 23/28–31; H01L 23/301; H01L 23/552; C09D 5/24; C09D 7/61; C09D 7/63
USPC ................ 361/816, 818, 760–764, 772–784; 174/520–525; 257/685–730, 787–790; 525/512–519
See application file for complete search history.

(56) References Cited

U.S. PATENT DOCUMENTS

| | | | | |
|---|---|---|---|---|
| 9,076,572 B2* | 7/2015 | Hsueh | ...................... | H01B 1/22 |
| 9,508,656 B2* | 11/2016 | Chiu | ........................ | H01L 24/97 |
| 9,872,005 B2* | 1/2018 | Tsukitani | ............. | G11B 27/031 |
| 10,081,735 B1* | 9/2018 | Niwayama | ............... | C08K 5/57 |
| 2003/0160313 A1 | 8/2003 | Ichihashi et al. | | |
| 2014/0326929 A1* | 11/2014 | Hsueh | ...................... | H01B 1/22 |
| | | | | 252/519.21 |
| 2015/0013764 A1* | 1/2015 | Matsumura | .............. | C08J 7/044 |
| | | | | 136/256 |
| 2015/0299550 A1* | 10/2015 | Kusunoki | ................ | C09K 5/14 |
| | | | | 252/75 |
| 2016/0190592 A1* | 6/2016 | Ochiai | .................. | H01G 11/46 |
| | | | | 429/217 |
| 2018/0163063 A1* | 6/2018 | Gao | ..................... | H05K 9/0083 |

FOREIGN PATENT DOCUMENTS

| | | |
|---|---|---|
| JP | 2010-113912 A | 5/2010 |
| JP | 2010-118280 A | 5/2010 |
| JP | 2011-192755 A | 9/2011 |
| JP | 2014-181316 A | 9/2014 |
| JP | 2015-130484 A | 7/2015 |
| JP | 2017-179361 A | 10/2017 |
| WO | 2017/170398 A1 | 10/2017 |

* cited by examiner

SHIELD PACKAGE

TECHNICAL FIELD

The present invention relates to a shield package including a package in which an electronic component is mounted on a substrate, and the electronic component is sealed with a sealing material, and a shield layer covering the package.

BACKGROUND ART

In an electronic device such as a mobile phone or a tablet terminal, recently, a wireless communication function using an electromagnetic wave of 10 MHz to 1000 MHz, such as radio frequency identification (RFID) or a non-contact charging function, has been provided, along with a plurality of electronic components. Such an electronic component has high sensitivity with respect to the electromagnetic wave, and is likely to cause a malfunction in the case of being exposed to an electromagnetic wave from the outside.

On the other hand, in order to make a reduction in size and weight and high functionality of the electronic device compatible, a package density of the electronic component is required to be increased. However, in a case where the package density is increased, the electronic component affected by the electromagnetic wave also increases.

From the related art, a so-called shield package in which a packing including an electronic component is covered with a shield layer, and thus, the infiltration of an electromagnetic wave with respect to the electronic component is prevented has been known as means for soling the problems described above. For example, in Patent Document 1, it is described that a conductive resin composition containing conductive particles is sprayed (atomized) to be applied onto a surface of a package, and is heated to be cured, and thus, it is possible to easily obtain an electromagnetic shield member having a high shielding effect.

In addition, for example, in Patent Documents 2 to 5, it is described that a micron-size conductive filler and a nano-size conductive filler are used together as a conductive paste that can be applied to an electromagnetic wave shield. It is described that the nano-size conductive filler is used together, and thus, a gap between the micron-size conductive fillers can he filled, and excellent shielding properties can be obtained.

CITATION LIST

Patent Document

Patent Document 1: JP-A-2003-258137
Patent Document 2: SP-A-2014-181316
Patent Document 3: SP-A-2005-294254
Patent Document 4: JP-A-2010-113912
Patent Document 5: JP-A-2010-118280

SUMMARY OF THE INVENTION

Technical Problem

However, there is no conductive paste focused on prevention of the infiltration of the electromagnetic wave of 10 MHz to 1000 MHz, and there is room for improvement in the shielding effect with respect to the electromagnetic wave of 10 MHz to 1000 MHz, in the shield layer of the conductive paste according to the related art.

In addition, in the case of using the nano-size conductive filler, an acrylic resin is generally used from the viewpoint of increasing dispersibility of the nano-size conductive filler. However, in a case where a conductive resin composition using the acrylic resin is applied to the shield layer, when the shield layer is exposed to a high temperature of a solder reflow step or the like, cohesiveness between the shield layer and the package easily decreases.

Further, it is considered that the conductive filler is blended at a high content, as means for improving the shielding effect with respect to the electromagnetic wave of 10 MHz to 1000 MHz, but in such a case, there is a concern that the problem of the cohesiveness between the shield layer and the package becomes more remarkable.

The invention has been made in consideration of the circumstances described above, and an object thereof is to provide a shield package having excellent shielding properties with respect to an electromagnetic wave of 10 MHz to 1000 MHz and excellent cohesiveness between a shield layer and a package.

Solution to Problem

A shield package of the invention, includes: a package in which an electronic component is mounted on a substrate, and the electronic component is sealed with a sealing material; and a shield layer including a first layer and a second layer that are sequentially laminated on the package, in which the first layer made from a conductive resin composition in which (A) 100 parts by mass of a binder component containing 5 parts by mass to 30 parts by mass of a solid epoxy resin that is a solid at a normal temperature and 20 parts by mass to 90 parts by mass of a liquid, epoxy resin that is a liquid at a normal temperature in a range not exceeding a total amount of 100 parts by mass, (B) 400 parts by mass to 1800 parts by mass of metal particles, and (C) 0.3 part by mass to 40 parts by mass of a curing agent are contained, the metal particles (B) include at least (B1) spherical metal particles and (B2 flaky metal particles, and a content ratio of the spherical metal particles (B1) to the metal particles (B) is 20 mass % to 80 mass %, and the second layer made from a conductive resin composition in which a binder component containing (D) a (meth)acrylic resin having a weight average molecular weight of 1000 or more and 400000 or less and (E) a monomer having a glycidyl group and/or a (meth)acryloyl group in molecules, (F) metal particles having an average particle diameter of 10 nm to 500 nm, (G) metal particles having an average particle diameter of 1 μm to 50 μm and (H) a radical polymerization initiator are contained, a total content of the metal particles (F) and the metal particles (G) is 2000 parts by mass to 80000 parts by mass with respect to 100 parts by mass of the binder component of the second layer, and a content ratio of the metal particles (F) to a total amount of the metal particles (F) and the metal particles (G) is 8 mass % to 85 mass %.

The binder component (A) is capable of further containing a monomer having a (meth)acryloyl group in molecules.

The monomer (E) can be a monomer having a glycidyl group and a (meth)acryloyl group in molecules.

The metal particles (G) can be at least one type selected from the group consisting of copper particles, silver-coated copper particles, and silver-coated copper alloy particles.

Advantageous Effects of the Invention

According to the shield package of the invention, it is possible to obtain excellent shielding properties with respect to an electromagnetic wave of 10 MHz to 1000 MHz and excellent cohesiveness between a package and a shield layer.

BRIEF DESCRIPTION OF THE DRAWINS

REFERENCE SIGNS LIST

A Package individualized on substrate
B Diced shield package
$B_1$, $B_2$, $B_9$ Shield package before being diced
1 Substrate
2 Electronic component
3 Ground circuit pattern (copper foil)
4 Sealing material
5 First layer (conductive coating film)
6 Second layer (conductive coating .film)
7a Flaky metal particles
7b Sperical metal particles
7c metal particles having an average particle diameter of 1 to 50 μm
7d metal particles having an average particle diameter of 10 to 500 nm
11 to 19 Groove
20 Substrate
21 Electrode pad
22 Cured material of conductive resin composition
211a Electric field wave shielding effect evaluation device
211b Magnetic field wave shielding effect evaluation device
213 Measurement tool
214 Central conductor
215 Measurement tool
216 Shield type circular loop antenna
221 Spectrum analyzer
222 Attenuator
223 Attenuator
224 Pre-amplifier

MODE FOR CARRYING OUT THE INVENTION

A shield package according to the invention, includes: a package in which an electronic component is mounted on a substrate, and the electronic component is sealed with a sealing material; and a shield layer including a first layer and a second layer that are sequentially laminated on the package.

<First Layer>

The first layer made from a conductive resin composition in which (A) 100 parts by mass of a binder component containing 5 parts by mass to 30 parts by mass of a solid epoxy resin that is a solid at a normal temperature and 20 parts by mass to 90 parts by mass of a liquid epoxy resin that is a liquid at a normal temperature in a range not exceeding a total amount of 100 parts by mass, (B) 400 parts by mass to 1800 parts by mass of metal particles, and (C) 0.3 part by mass to 40 parts by mass of a curing agent are contained.

The binder component of the conductive resin composition that is applied to the first layer contains an epoxy resin as an essential component, and as necessary, is also capable of further containing a monomer having a (meth)acryloyl group. Note that, herein, the "(meth)acryloyl group" is a general term of an acryloyl group and a methacryloyl group, and the "monomer having a (meth)acryloyl group" includes an oligomer or a prepolymer having a molecular weight of less than 1000.

Here, the "solid at a normal temperature" indicates a state not having fluidity in a solvent-tree state at 25° C., and the "liquid at a normal temperature" indicates a state having fluidity in the same condition. The solid epoxy resin is preferably 5 parts by mass to 30 parts by mass, and is more preferably 5 parts by mass to 20 parts by mass, in 100 parts by mass of the binder component. In addition, the liquid epoxy resin is preferably 20 parts by mass to 90 parts by mass, and is more preferably 25 parts by mass to 80 parts by mass, in 100 pasts by mass of the binder component.

A conductive resin composition that is capable of being homogeneously applied onto a package surface, and thus, is capable of forming a shield layer without any unevenness can be obtained by using the epoxy resin that is a solid at a normal temperature. It is preferable that the solid epoxy resin has two or more glycidyl groups in molecules, and has an epoxy equivalent of 150 g/eq to 280 g/eq. In a case where the epoxy equivalent is 150 g/eq or more, a defect such as a crack or bow is less likely to occur, and in a case where the epoxy equivalent is 280 g/eq or less, a coating film having more excellent heat resistance is easily obtained.

The solid epoxy resin can be used by being dissolved in a solvent. The solvent that is used is not particularly limited, but can be suitably selected from the followings.

Specific examples of the solid epoxy resin are not particularly limited to the followings, but include a bisphenol type epoxy resin such as a bisphenol A type epoxy resin, a bisphenol F type epoxy resin, and a bisphenol S type epoxy resin; a spirocycle type epoxy resin; a naphthalene type epoxy resin; a biphenyl type epoxy resin; a terpene type epoxy resin; a glycidyl ether type epoxy resin such as tris(glycidyl oxyphenyl) methane and tetrakis(glycidyl oxyphenyl) ethane; a glycidyl amine type epoxy resin such as tetraglycidyl diaminodiphenyl methane; a novolac type epoxy resin such as a tetrabromobisphenol A type epoxy resin, a cresol novolac type epoxy resin, a phenol novolae type epoxy resin, an α-naphthol novolac type epoxy resin, and a brominated phenol novolac type epoxy resin; a rubber-modified epoxy resin, and the like. One type of the resins can be independently used, and two or more types thereof can also be used together.

As described above, 20 parts by mass to 90 parts by mass of the epoxy resin that is a liquid at a normal temperature in 100 parts by mass of the binder component is used, and among them, it is preferable that a liquid glycidyl amine type epoxy resin is 5 parts by mass to 35 parts by mass, and it is preferable that a liquid glycidyl ether type epoxy resin is 20 parts by mass to 55 parts by mass. In a case where the liquid glycidyl amine type epoxy resin and the liquid glycidyl ether type epoxy resin are used by being combined in such a range of a blending amount, the bow of the coating film after curing further decreases, conductivity and cohesiveness of the shield layer are excellent in a balanced manner, and a shield package having a more excellent heat resistance is obtained.

It is preferable that the liquid glycidyl amine type liquid epoxy resin has an epoxy equivalent of 80 g/eq to 120 g/eq and a viscosity of 1.5 Pa·s or less, and more preferably, the viscosity is 0.5 Pa·s to 1.5 Pa·s. It is preferable that the liquid glycidyl ether tape epoxy resin has an epoxy equivalent of 180 g/eq to 220 g/eq and a viscosity of 6 Pa·s or less, and more preferably, the viscosity is 1 Pa·s to 6 Pa·s. In the case of using the liquid glycidyl amine type epoxy resin and the liquid glycidyl ether type epoxy resin of which the epoxy equivalent and the viscosity are in the preferred range described above, the bow of the coating film after curing further decreases, and a shield package having more excellent heat resistance and a more homogeneous thickness of the coating film is obtained.

Here, the viscosity of the liquid glycidyl amine type liquid epoxy resin is a value that is measured at a liquid temperature 25° C. by a BH type viscosimeter (Rotor No. 5, a number of rotations of 10 rpm).

The monomer having a (meth)acryloyl group capable of being used in the conductive resin composition that is applied to the first layer is not particularly limited insofar as the monomer is a compound having an acryloyl group or a methacryloyl group. Examples of such a compound include isoamyl acrylate, neopentyl glycol diacrylate, trimethylol propane triacrylate, ditrimethylol propane tetraacrylate, 2-hydroxy-3-acryloiloxypropyl methacrylate, a phenyl glycidyl ether acrylate hexamethylene diisocyanate urethane prepolymer, a bisphenol A diglycidyl acrylic ether adduct, ethylene glycol dimethacrylate, diethylene glycol dimethacrylate, and the like. One type of the compounds can be independently used, and two or more types thereof can also be used together.

As described above, in the case of using the monomer having a (meth)acryloyl group, a content ratio of the monomer having a (meth)acryloyl group to a total amount of the epoxy resin and the monomer having a (meth)acryloyl group is preferably 5 mass % to 95 mass %, and is more preferably 20 mass % to 80 mass %. The monomer having a (meth) acryloyl group is 5 mass % or more, and thus, it is possible to rapidly cure the conductive resin composition, and to prevent the sagging of the conductive resin composition at the time of curing. In addition, in a case where the monomer having a (meth)acryloyl group is 95 mass% or less, cohesiveness between the package and the shield layer is more likely to be excellent.

In order to improve physical properties of the conductive resin composition, an alkyd resin, a melamine resin, a xylene resin, and the like can be added to the binder component, as a modifier, in addition to the epoxy resin and the monomer having a (meth)acryloyl group.

A blending ratio in the case of blending the binder component with the modifier is preferably 40 mass % or less, and is more preferably 10 mass % or less, with respect to the binder component, from the viewpoint of the cohesiveness between the shield layer and the package.

The metal particles (B) of the conductive resin composition that is applied to the first layer are not particularly limited, but examples of the metal particles include copper particles, silver particles, nickel particles, silver-coated copper particles, silver-coated copper alloy particles, gold-coated copper particles, silver-coated nickel particles, gold-coated nickel particles, and the like.

The silver-coated copper particles include copper particles, and a silver layer or a silver-containing layer covering at least a part of the copper particles, and the silver-coated copper alloy particles include copper alloy particles, and a silver layer or a silver-containing layer covering at least a part of the copper alloy particles. In the copper alloy particles, for example, the content of nickel is 0.5 mass % to 20 mass %, the content of zinc is 1 mass % to 20 mass %, and the residue is copper, and residual copper may contain inevitable impurities. As described above, it is possible to obtain a shield package excellent in shielding properties by using the copper alloy particles including the silver-coated layer.

In addition, the metal particles (B) essentially include spherical and flaky (scale-like) metal particles, and as necessary, dendritic or fibrous mend particles can also be used together. Note that, the spherical shape includes not only an approximately true spherical shape (an atomized powder) but also an approximately spherical shape such as an approximately polyhedral sphere (a reduced powder) or an irregular shape (an electrolytic powder).

A content ratio of a total amount of the spherical metal particles (B1) and the flaky metal particles (B2) in a total amount of the metal particles (B) is not particularly limited, but is preferably 40 mass % to 100 mass %, is more preferably 60 mass % to 100 mass %, and is even more preferably 80 mass % to 100 mass %.

In addition, a content ratio of the spherical metal particles (B1) in the total amount of the metal particles (B) is preferably 20 mass % to 80 mass %, and is more preferably 25 mass % to 75 mass %.

The content of the metal particles (B) (a total amount of the spherical and flaky metal particles and metal articles of other shapes) is 400 parts by mass to 1800 parts by mass, is preferably 500 parts by mass to 1800 parts by mass, and is more preferably 500 parts by mass to 1700 parts by mass, with respect to 100 parts by mass of the binder component. In a case where the content of the metal particles is 400 parts by mass or more, the conductivity of the shield layer is excellent, and in a case where the content is 1800 parts by mass or less, the cohesiveness between the shield layer and the package and physical properties of the shield layer are excellent, and the chip of the shield layer is less likely to occur at the time of being cut with a dicing saw described below.

In addition, it is preferable that an average particle diameter of the metal particles (B) is 1 μm o 30 μm, in both the spherical and flaky metal particles. In a case where the average particle diameter of the metal particles (B) is 1 μm or more, the dispersibility of the metal particles is excellent, the aggregation of the metal particles can be prevented, and the metal particles are less likely to be oxidized, and in a case where the average particle diameter is 30 μm or less, connection properties with respect to a ground circuit of the package are excellent.

Herein, the average particle diameter indicates a particle diameter of an average particle diameter D50 (a median size) based on the number of particles that is measured by a laser diffraction scattering method.

In addition, a tap density of the flaky metal particles (B2) is not particularly limited, but is preferably 4.0 g/cm$^3$ to 6.0 g/cm$^3$. In a case where the tap density is in the range described above, the conductivity of the shield layer is excellent.

In addition, an aspect ratio of the flaky metal particles (B2) is not particularly limited, but is preferably 5 to 20, and is more preferably 5 to 10. In a case where the aspect ratio is in the range described above, the conductivity of the shield layer is more excellent.

In the conductive resin composition that is applied to the first layer, the curing agent (C) for curing the binder component is used. The curing agent (C) is not particularly limited, but for example, an imidazole-based curing agent, a phenolic curing agent, a naphthol-based curing agent, an amine-based curing agent, a cationic curing agent, a radical curing agent, and the like can be used as the curing agent, and among them, the imidazole-based curing agent, the phenolic curing agent, and the naphthol-based curing agent are preferable, and the imidazole-based curing agent is more preferable. One type of the curing agents (C) can be independently used, and two or more types thereof may be used together.

Examples of the imidazole-based curing agent include imidazole, 2-undecyl imidazole, 2-heptadecyl imidazole, 2-methyl imidazole, 2-ethyl imidazole, 2-phenyl imidazole, 2-ethyl-4-methyl-imidazole, 1-cyanoethyl-2-undecyl imidazole, 1-cyanoethyl-2-methyl imidazole, 1-cyanoethyl-2-undecyl imidazolium trimellitate, 1-cyanoethyl-2-ethyl-4-methyl imidazole, and the like.

The phenolic curing agent is a compound that has at least one phenol skeleton in molecules and can be used as the curing agent of the epoxy resin, and examples of the phenolic curing agent include phenol novolac (a novolac type phenol resin), a triphenyl methane type phenol resin, a dicyclopentadiene type novolac resin, and the like, and the novolac type phenol resin is preferable as the phenolic curing agent.

The naphthol-based curing agent is a compound that has at least one naphthol skeleton in molecules and can be used as the curing agent of the epoxy resin, and examples of the naphthol-based curing agent include a naphthol-cresol-formaldehyde resin, a phenol-naphthol-based aralkyl resin, a Xylok type novolac resin, and the like.

Examples of the cationic curing agent include an onium-based compound represented by an amine salt of boron trifluoride, P-methoxy benzene diazonium hexafluorophosphate, diphenyl iodonium hexafluorophosphate, triphenyl sulfonium, tetra-n-butyl phosphonium tetraphenyl borate, tetra-n-butyl phosphonium-o,o-diethyl phosphorodithioate, and the like.

Examples of the radical curing agent (a polymerization initiator) include dicumyl peroxide, t-butyl cumyl peroxide, t-butyl hydroperoxide, cumene hydroperoxide, and the like.

The content of the curing agent (C) is preferably 0.3 part by mass to 40 parts by mass, and is more preferably 0.5 part by mass to 35 parts by mass, with respect to 100 parts by mass of a total amount of the binder component. In a case where the content of the curing agent is 0.3 part by mass to 40 parts by mass, the cohesiveness between the shield layer and the package and the conductivity of the shield layer are excellent, and a shield layer excellent in a shielding effect is easily obtained. In addition, in a case where the radical curing agent is used as the curing agent, the content of the radical curia agent is preferably 0.3 part by mass to 8 parts by mass with respect to 100 parts by mass of the total amount of the binder component. In a case where the content of the radical curing agent is 0.3 part by mass to 8 parts by mass, the cohesiveness between the shield layer and the package and the conductivity of the shield layer are excellent, and the shield layer excellent in the shielding effect is easily obtained.

It is preferable that the conductive resin composition that is applied to the first layer has a viscosity lower than that of a so-called conductive paste, in order to enable the conductive resin composition to be homogeneously applied onto the package surface by spray atomization. It is preferable that the viscosity of the conductive resin composition is suitably adjusted in accordance with a device that is used in coating, and the viscosity is not particularly limited, but a general standard is as follows. A measurement method of the viscosity is not also limited, but in a case where the conductive resin composition has a low viscosity, the viscosity can be measured by a conical plate type rotation viscosimeter (a so-called cone-plate type viscosimeter), and in a case where the conductive resin composition has a high viscosity, the viscosity can be measured by a single cylindrical rotation viscosimeter (a so-called B type or BH type viscosimeter).

In a case where the viscosity is measured by the conical plate type rotation viscosimeter, a viscosity that is measured at 0.5 rpm by using a cone spindle CP40 (Cone Angle: 0.8° and Cone Radius: 24 mm) manufactured by BROOK FIELD is preferably 100 mPa·s or more, and is more preferably 150 mPa·s or more. In a case where the viscosity is 100 mPa·s or more, a liquid drip in a case where a coating surface is not horizontal is prevented, and thus, it is easy to form the shield layer without unevenness. Note that, in a case where the viscosity is close to or lower than 100 mPa·s, a method of repeating an operation of forming a thin film by decreasing a single coating amount, and of further forming a thin film thereon, that is, a method of performing so-called recoating method is effective in order to obtain a homogeneous coating film having a desired thickness. Note that, there is no problem even in a case where the viscosity is high insofar as the viscosity can be measured by the conical plate type rotation viscosimeter.

In a case where the viscosity is measured by the single cylindrical rotation viscosimeter, a viscosity that is measured at 10 rpm by using a rotor No. 5 is preferably 30 dPa·s or less, and is more preferably 25 dPa·s or less. In a case where the viscosity is 30 dPa·s or less, the clogging of a spray nozzle is prevented, and thus, it is easy to form the shield layer without unevenness. Note that, there is no problem even in a case where the viscosity is low insofar as the viscosity can be measured by the single cylindrical rotation viscosimeter.

The viscosity of the conductive resin composition is different in accordance with the viscosity of the binder component, the content of a conductive filler, or the like, and thus, a solvent can be used in order to set the viscosity of the conductive resin composition to be in the range described above. A seal vent that can be used in the invention is not particularly limited, but examples of the solvent include methyl ethyl ketone, propylene glycol monomethyl ether, 3-methoxy-3-methyl-1-butyl acetate, acetone, acetophenone, methyl cellosolve, methyl cellosolve acetate, methyl carbitol, diethylene glycol dimethyl ether, tetrahydrofuran, dioctyl, methyl acetate, butyl acetate, and the like. One type of the solvents can be independently used, and two or more types thereof may be used together.

It is preferable that the content of the solvent is suitably adjusted in accordance with a device or the like that is used in coating, but in general, it is preferable that the content is 20 parts by mass to 600 parts by mass with respect to 100 parts by mass of the binder component. In a case where the content of the solvent, is 20 parts by mass to 600 parts by mass, coating stability of spray coating is excellent, and a stable shielding effect is easily obtained.

In addition, known additives such as a defoaming agent, a thickener, a pressure-sensitive adhesive, a filler, a flame retarder, and a colorant can be added to the conductive resin composition that is applied to the first layer, within a range not impairing the object of the invention.

Apart of the metal particles (B) is exposed from the surface of the first layer formed by curing the conductive resin composition described above, and thus, stable electrical connection with respect to the second layer is obtained.

<Second Layer>

The second layer described above made from a conductive resin composition in which a binder component containing (D) a (meth)acrylic resin having a weight average molecular weight of 1000 or more and 400000 or less and (E) a monomer having a glycidyl group and/or a (meth) acryloyl group in molecules, (F) metal particles having an average particle diameter of 10 nm to 500 nm, (G) metal particles having an average particle diameter of 1 μm to 50 μm, and (H) a radical polymerization initiator are contained.

The (meth)acrylic resin (D) is a polymer containing at least acrylic ester and/or methacrylate ester as a constituent monomer, and is not particularly limited, but for example, a polymer containing at least one type selected from the group consisting of methyl acrylate, ethyl acrylate, propyl acrylate, n-butyl acrylate, methyl methacrylate, ethyl methacrylate, propyl methacrylate, and n-butyl methacrylate, as the constituent monomer, can be used. The constituent monomer may contain other than acrylic ester or methacrylate ester, within a range not contrary to the object of the invention. In the case of containing two or more types of the monomers, the (meth)acrylic resin may be an alternate copolymer, may be a random copolymer, may be a block copolymer, or may be a graft copolymer. Here, the "(meth)acrylic resin" is a general term of an "acrylic resin" and a "methacrylic resin".

The weight average molecular weight of the (meth)acrylic resin (D) is 1000 or more, is preferably 5000 or more, is more preferably 7000 or more, and is even more preferably 10000 or more. In addition, the weight average molecular weight is 400000 or less, is preferably 200000 or less, is more preferably 150000 or less, and is even more preferably 50000 or less.

For example, a copolymer for a burning paste or the like according to JP-A-2016-155920, JP-A-2015-59196, JP-A-2016-196606, and WO 2016/132814 can be used as such a (meth)acrylic resin. In addition, an acrylic resin that is commercially available can also be used, and for example, "KC4100" or "KC-1700P", manufactured by Kyoeisha Chemical Co Ltd. can be used, as the (meth)acrylic resin.

The monomer (E) is a compound having a glycidyl group and/or a (meth)acryloyl group in molecules, and is preferably a compound having a glycidyl group and a (meth) acryloyl group in molecules. Note that herein, the "monomer (E)" also contains an oligomer or a prepolymer having a molecular weight of less than 1000.

The compound having a glycidyl group is not particularly limited, but examples of the compound include a glycidyl compound such as ethyl glycidyl ether, butyl glycidyl ether, t-butyl glycidyl ether, allyl glycidyl ether, benzyl glycidyl ether, glycidyl phenyl ether, bisphenol A, and diglycidyl ether, and the like.

The compound having a (meth)acryloyl group is not particularly limited insofar as the compound has an acryloyl group or a methacryloyl group, but examples of the compound include isoamyl acrylate, neopentyl glycol diacrylate, trimethylol propane triacrylate, ditrimethylol propane tetraacrylate, 2-hydroxy-3-acryloiloxypropyl methacrylate, ethylene glycol dimethacrylate, diethylene glycol dimethacrylate, and the like.

Examples of the compound having a glycidyl group and a (meth)acryloyl group include acrylate glycidyl ether, methacrylate glycidyl ether, 4-hydroxybutyl acrylate glycidyl ether, a bisphenol A diglycidyl acrylic ether adduct, a phenyl glycidyl ether acrylate hexamethylene diisocyanate urethane prepolymer, and the like.

One type of the monomers (E) can be independently used, and two or more types thereof can also be used together. As described above, in a case where the acrylic resin is used in the conductive resin composition, cohesiveness between the shield layer and a coating target, such as the package, after heating and curing tends to decrease, but the monomer (E) is used together in the (meth)acrylic resin (D) described above, and thus, even in a case where the metal particles (F) and the metal particles (G) are blended at a high content, excellent cohesiveness between the shield layer and the coating target, that is, in the invention, excellent cohesiveness between the first layer and the second layer is obtained.

The content of the monomer (E) is preferably 20 parts by mass to 99 parts by mass, is more preferably 40 parts by mass to 99 parts by mass, and is even more preferably 50 parts by mass to 99 parts by mass, in 100 parts by mass of a total amount of the (meth)acrylic resin (D) and the monomer (E). Hereinafter, a component containing both of the (meth)acrylic resin (D) and the monomer (E) is the binder component in the conductive resin composition that is applied to the second layer.

The metal particles (1) having an average particle diameter of 10 nm to 500 nm are not particularly limited, but copper nanoparticles, silver nanoparticles and gold nanoparticles are preferable as the metal particles. It is possible to fill a gap between micron-size metal particles by setting the average particle diameter of the metal particles (F) to be 10 nm to 500 nm, and thus, the conductive filler is easily blended at a content, and it is possible to improve shielding properties with respect to an electromagnetic wave of 10 MHz to 1000 MHz.

The content of the metal particles (F) is not particularly limited, but is preferably 50 parts by mass to 75000 parts by mass, is more preferably 100 parts by mass to 35000 parts by mass, is even more preferably 300 parts by mass to 10000 parts by mass, and is particularly preferably 500 parts by mass to 5000 parts by mass, with respect to 100 parts by mass of the binder component (the binder component of the second layer, the same applies to the followings).

The metal particles (G) having an average particle diameter of 1 μm to 50 μm are not particularly limited, but copper particles, silver particles, gold particles, silver-coated copper particles, or .silver-coated copper alloy particles are preferable, and the copper particles, the silver-coated copper particles, or the silver-coated copper alloy particles are mere preferable from the viewpoint of a cost reduction. In a case where the average particle diameter of the metal particles (G) is 1 μm or more, the dispersibility of the metal particles (G) is excellent, the aggregation of the metal particles can be prevented, and the metal particles are less likely to be oxidized, and in a case where the average particle diameter is 50 μm or less, the connection properties with respect to the ground circuit of the package are excellent.

Examples of the metal particles (G) include flaky (scale-like) metal particles, dendritic metal particles, spherical metal particles, fibrous metal particles, irregular (polyhedral) metal particles, and the like, and the flaky metal particles are preferable from the viewpoint of obtaining a shield layer in which a resistance value is lower and the shielding properties are further improved.

In addition, in a case where the metal particles (G) are the flaky metal particles, it is preferable that a tap density of the metal particles (G) is 4.0 g/cm$^3$ to 6.5 g/cm$^3$. In a case where the tap density is in the range described above, the conductivity of the shield layer is more excellent.

In addition, in a case where the metal particles (G) are the flaky metal particles, it is preferable that an aspect ratio of the metal particles (G) is 2 to 10. In a case where the aspect ratio is in the range described above, the conductivity of the shield layer is more excellent.

The content of the metal particles (G) is not particularly limited, but is preferably 400 parts by mass to 75000 parts by mass, is more preferably 400 parts by mass to 55000 parts by mass, is even more preferably 400 parts by mass to 45000 parts by mass, and is particularly preferably 400 parts by mass to 30000 parts by mass, with respect to 100 parts by mass of the binder component. In a case where the content is 400 parts by mass or more, the conductivity of the shield layer is excellent, and excellent shielding properties with respect to an electromagnetic wave in a low-frequency region of a band of 10 MHz are easily obtained, and in a case where the content is 75000 parts by mass or less, the cohesiveness between the first layer and the second layer and the properties of the shield layer are snore likely to be excellent, and the chip of the shield layer is less likely to occur at the time of being cut with a dicing saw described below.

A total content of the metal particles (F) and the metal particles (G) is 2000 parts by mass to 80000 parts by mass, is preferably 2000 parts by mass to 65000 parts by mass, is more preferably 2000 parts by mass to 50000 parts by mass, and is even more preferably 2000 parts by mass to 35000 parts by mass, with respect to 100 parts by mass of the binder component. In a case where the total content is set to be 2000 parts by mass or more, excellent shielding effect with respect to the electromagnetic wave in the low-frequency region of the band of 10 MHZ are easily obtained, and in a case where the total content is set to be 80000 parts by mass or less, excellent cohesiveness between the first layer and the second layer is easily obtained.

A content ratio of the metal particles (F) to the total amount of the metal particles (F) and the metal particles (G) is not particularly limited, but is preferably 8 mass % to 85 mass %.

The radical polymerization initiator (H) is not particularly limited, but for example, a thermal polymerization initiator that initiates a radical polymerization by heating, or an energy ray polymerization initiator that initiates a radical polymerization by the irradiation of an energy ray such as an X ray or UV can be used as the radical polymerization initiator.

The radical polymerization initiator is not particularly limited, but an organic peroxide-based compound or an azo-based compound that is used in the related art can be suitably used as the radical polymerization initiator.

Examples of the organic peroxide-based polymerization initiator include methyl ethyl ketone peroxide, cyclohexane peroxide, methyl cyclohexane peroxide, methyl acetoacetate peroxide, acetyl acetate peroxide. 1,1-bis(t-hexyl peroxy)-3,3,5-trimethyl cyclohexane, 1,1-bis(t-hexyl peroxy)-cyclohexane, 1,1-bis(t-butyl peroxy)-3,3,5-trimethyl cyclohexane, 1,1-bis(t-butyl peroxy)-2-methyl cyclohexane, 1,1-bis(t-butyl peroxy)-cyclohexane, 1,1-bis(t-butyl peroxy) cyclododecane, t-hexyl peroxybenzoate, 2,5-dimethyl-2,5-bis(benzoyl peroxy)hexane, t-butyl peroxyallyl monocarbonate, t-butyl trimethyl silyl peroxide, 3,3',4,4'-tetra(t-butyl peroxycarbonyl) benzophenone, 2,3-dimethyl-2,3-diphenyl butane, and the like.

In addition, examples of the azo-based polymerization initiator include 2-phenyl azo-4-methoxy-2,3-dimethyl valeronitrile, 1-[(1-cyano-1-methyl ethyl)azo]formamide, 1,1'-azobis(cyclohexane-1-carbonitrile), 2,2'-azobis(2-methyl butyronitrile), 2,2'-azobisisobutyronitrile, 2,2'-azobis(2,4-dimethyl valeronitrile), 2,2'-azobis(2-methyl propione amidine) dihydrochloride, 2,2'-azobis(2-methyl-N-phenyl propione amidine) dihydrochloride, 2,2'-azobis[N-(4-chlorophenyl)-2-methyl propione amidine] dihydride chloride, 2,2'-azobis[N-(4-hydrophenyl)-2-methyl propione amidine] dihydrochloride, 2,2'-azobis[2-methyl-N-(phenyl methyl) propione amidine] dihydrochloride, and 2,2'-azobis (isobutyric) dimethyl.

One type of the radical polymerization initiators described above can be independently used, and two or more types thereof can also be used together.

The content of the radical polymerization initiator (H) may be an amount that is stoichiometrically necessary for the binder component, is different in accordance with the type thereof, and as a rough standard, is preferably 0.05 part by mass to 30 parts by mass, is more preferably 0.1 part by mass to 25 parts by mass, and is even more preferably 1 parts by mass to 20 parts by mass, with respect to 100 parts by mass of the binder component, in a case where the content of the radical polymerization initiator is in such a range, the conductive resin composition is sufficiently cured, the cohesiveness between the first layer and the second layer and the conductivity of the shield layer are excellent, and a shield layer excellent in the shielding effect is easily obtained. In addition, it is possible to use the radical polymerization initiator in accordance with an object such as a reduction in a curing time or long-term storage stability at a room temperature, by selecting the type or the amount of radical polymerization initiator.

In addition, known additives such as a defoaming agent, a thickener, a pressure-sensitive adhesive, a filler, a flame retarder, and a colorant can be added to the conductive resin composition that is applied to the second layer, within a range not impairing the object of the invention.

It is preferable that the conductive resin composition that is applied to the second layer has a viscosity lower than that of a so-called conductive paste, in order to enable the conductive resin composition to be homogeneously applied onto the package surface by spray atomization. It is preferable that the viscosity of the conductive resin composition is suitably adjusted in accordance with a device that is used in coating, and the viscosity is not particularly limited, but a general standard is as described in the first layer described above.

The viscosity of the conductive resin composition is different in accordance with the viscosity of the binder component, the content of the conductive filler, or the like, and thus a solvent can be used in order to set the viscosity of the conductive resin composition to be in the range described above. A solvent that can be used in the invention is not particularly limited, but examples of the solvent include propylene glycol monomethyl ether, 3-methoxy-3-methyl-1-butanol, 3-methoxy-3-methyl-1-butyl acetate, acetone, methyl ethyl ketone, acetophenone, methyl cellosolve, methyl cellosolve acetate, methyl carbitol, diethylene glycol dimethyl ether, tetrahydrofuran, methyl acetate, butyl acetate, and the like. One type of the solvents can be independently used, and two or more types thereof may be used together.

The content of the solvent is different in accordance with the viscosity of the binder component, the content of the conductive filler, or the like, but as a rough standard, is approximately 10 mass % to 60 mass % with respect to a total amount of the components contained in the conductive resin composition (excluding the solvent).

It is preferable that a specific resistance of the second layer of the shield package of this embodiment is $5.0 \times 10^{-5}$ $\Omega \cdot cm$ or less, from the viewpoint of obtaining an excellent shielding effect with respect to the electromagnetic wave in the low-frequency region of the band of 10 MHZ.

<Manufacturing Method of Shield Package>

One embodiment of a manufacturing method of the shield package of this embodiment will be described by using the drawings.

Figure 1:
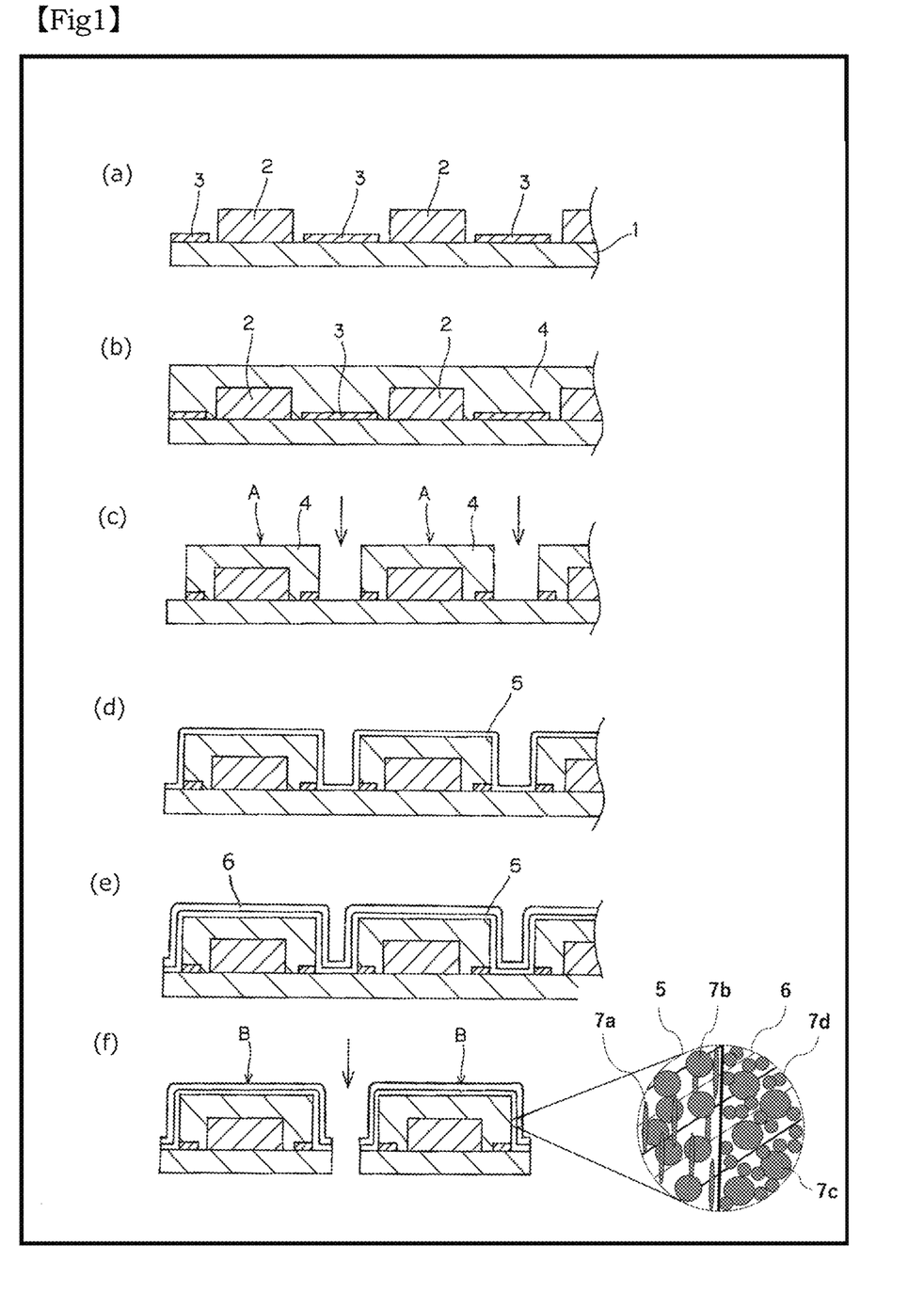
FIG. 1 is a schematic sectional view illustrating one embodiment of a manufacturing method of a shield package.

First, as illustrated in FIG. 1(a), a plurality of electronic components (ICs or the like) 2 are mounted on a substrate 1, and a ground circuit pattern (a copper foil) 3 is provided in the plurality of electronic components 2.

As illustrated in FIG. 1(b), a sealing material 4 is applied onto the electronic components 2 and the ground circuit pattern 3, and is cured, and thus, the electronic components 2 are sealed.

As illustrated by an arrow in FIG. 1(c), the sealing material 4 is cut in the plurality of electronic components 2, and thus, groove portions are formed, and a package of each of the electronic components of the substrate 1 is individualized by such groove portions. Reference numerals A respectively represent the individualized packages. At least a part of the ground circuit is exposed from a wall surface configuring the groove, and a bottom portion of the groove does not completely penetrate through the substrate.

On the other hand, the binder component (A), the metal particles (B), and the curing agent (C) described above are mixed at a predetermined amount, and thus, the conductive resin composition for the first layer is prepared.

In addition, the binder component containing the (meth) acrylic resin (D) and the monomer (E), the metal particles (F), the metal particles (G), and the radical polymerization initiator (H) are mixed at a predetermined amount, and thus, the conductive resin composition for the second layer is prepared.

The conductive resin composition for the first layer is injected in a mist state by a known spray gun or the like, and is evenly applied onto the package surface. At this time, an injection pressure, an injection flow rate, or a distance between an injection port of the spray gun and the package surface is suitably set, as necessary.

The package that is coated with the conductive resin composition described above is heated to cure the conductive resin composition, and thus, as illustrated in FIG. 1(d), a first layer (a conductive coating film) 5 is formed on the package surface. At this time, a heating condition can be suitably set.

Figure 2:
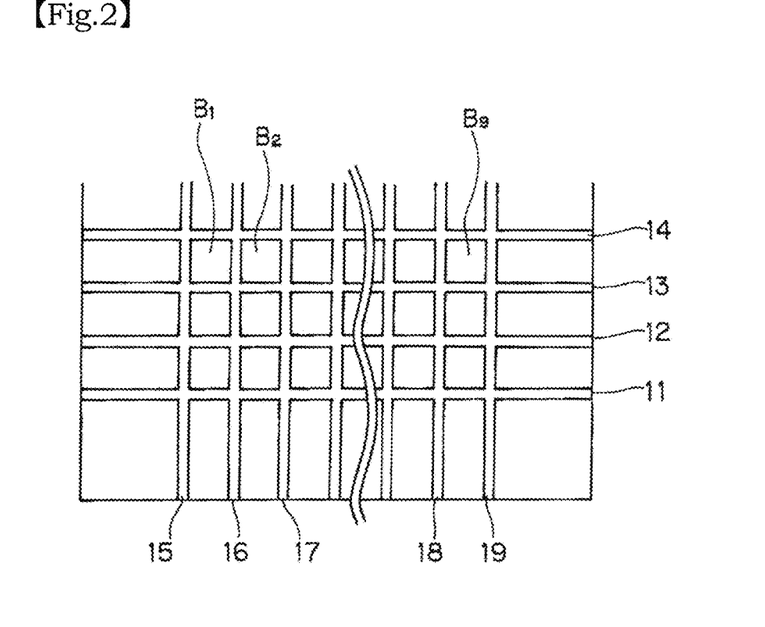
FIG. 2 is a plan view illustrating an example of a shield package before being individualized.

The conductive resin composition for the second layer is also applied as with the conductive resin composition for the first layer, and the package that is coated with the conductive resin composition is heated to sufficiently dry the solvent, and then the conductive resin composition is heated to be cured, and thus, as illustrated in FIG. 1(e), a second layer (a conductive coating film) 6 is formed on the package surface. FIG. 2 is a plan view illustrating the substrate in such a state. Reference numerals $B_1$, $B_2$, . . . $B_9$ respectively represent shield packages before being diced, and reference numerals 11 to 19 respectively represent grooves between the shield packages.

As illustrated by an arrow in FIG. 1(f), the substrate is cut by a dicing saw or the like, along a bottom portion of the groove of the package before dicing, and thus, a diced shield package B is obtained. In the exploded view of FIG 1(f), 7a: flaky metal particles, 7b: spherical metal particles, 7c: metal particles havinng an average particle diameter of 1 to 50 μm, and 7d: metal particles having an average particles diameter of 10 to 500 nm.

In the diced shield package B that is obtained as described above, a homogeneous shield layer is formed on the package surface (any of an upper surface portion, a lateral surface portion, a corner portion of the boundary between the upper surface portion and the lateral surface portion), and thus, an excellent shielding effect is obtained. In addition, the first layer is excellent in cohesiveness with respect to the package surface and cohesiveness with respect to the copper foil of the ground circuit that is exposed from a part of the package, and the second layer is excellent in cohesiveness with respect to the first layer. For this reason, when the conductive resin composition is applied onto the package surface, and the shield layer is formed, and then, the package is diced by being cut, and thus, it is possible to prevent the shield layer from being peeled off from the ground circuit by a cutting impact.

EXAMPLES

Hereinafter, the contents of the invention will be described in detail, on the basis of examples, but the invention is not limited to the followings. In addition, hereinafter, "part" or "%" is based on a mass unless otherwise specified.

<First Layer>

The metal particles, the curing agent, and the solvent were blended and mixed at ratios shown in Tables 1 and 2, with respect to 100 parts by mass of a total amount of the solid epoxy resin, the liquid epoxy resin (the glycidyl amine type epoxy resin and the glycidyl ether type epoxy resin), and the monomer, described below, and thus, a conductive resin composition 1 was obtained. The details of each of the used components are as follows.

Solid Epoxy Resin: Product Name "JER157S70", manufactured by Mitsubishi Chemical Corporation Glycidyl Amine Type Epoxy Resin: Product Name "EP-3905S", manufactured by ADEKA Corporation Glycidyl Ether Type Epoxy Resin: Product Name "EP-4400", manufactured by ADEKA Corporation Monomer (A): 2-hydroxy-3-acryloiloxypropyl methacrylate, Product Name "Lightester G-201P", manufactured by Kyoeisha Chemical Co., Ltd.

Metal Particles (B1): Spherical Reduced Silver Particles, Average Particle Diameter of 2 μm Metal Particles (B2): Flaky Silver Particles, Average Particle Diameter 5 μM, Aspect Ratio=5

Caring Agent (C1): 2-Methyl Imidazole, Product Name "2MZ-H", manufactured by SHIKOKU CHEMICALS CORPORATION Curing Agent (C2): Phenol Novolac, Product Name "Tamanol 758", manufactured by ARAKAWA CHEMICAL INDUSTRIES, LTD.

Solvent: 1-Methoxy-2-Propanol (PGME)

<Second Layer>

The metal particles (F), the metal particles (G), the radical polymerization initiator (H), and the solvent were blended and mixed at ratios shown in Table 1, with respect to 100 parts by mass of a total amount of the (meth)acrylic resin (D) and the monomer (E), described below, and thus, a conductive resin composition 2 was obtained. The details of each of the used components are as follows.

(Meth)Acrylic Resin (D1): Molecular Weight=17000

(Meth)Acrylic Resin (D2): Molecular Weight=100000, "KC-1700P", manufactured by Kyoeisha Chemical Co., Ltd.

(Meth)Acrylic Resin (D3): Molecular Weight=130000, "KC-1100", manufactured by Kyoeisha Chemical Co., Ltd.

Monomer (E1): 4-Hydroxybutyl Acrylate Glycidyl Ether

Monomer (E2): "Lightacrylate P-1 A(N)", manufactured by Kyoeisha Chemical Co., Ltd.

Monomer (E3): "ED503", manufactured by ADEKA Corporation

Metal Particles (F): Silver Particles (Average Particle Diameter=150 nm)

Metal Particles (G): Silver-Coated Copper Alloy Particles (Average Particle Diameter=5 μm, Flaky Metal Particles, Aspect Ratio=2 to 10, Tap Density=5.8 g/cm$^3$)

Radical Polymerization Initiator (H): 2,2'-Azobis(Isobutyric Acid) Dimethyl

Solvent: Methyl Ethyl Ketone (MEK)

The evaluation of examples and comparative examples was performed as follows. Results are shown in Tables 1 and 2.

(1) Conductivity of Conductive Coating Film

Figure 3:
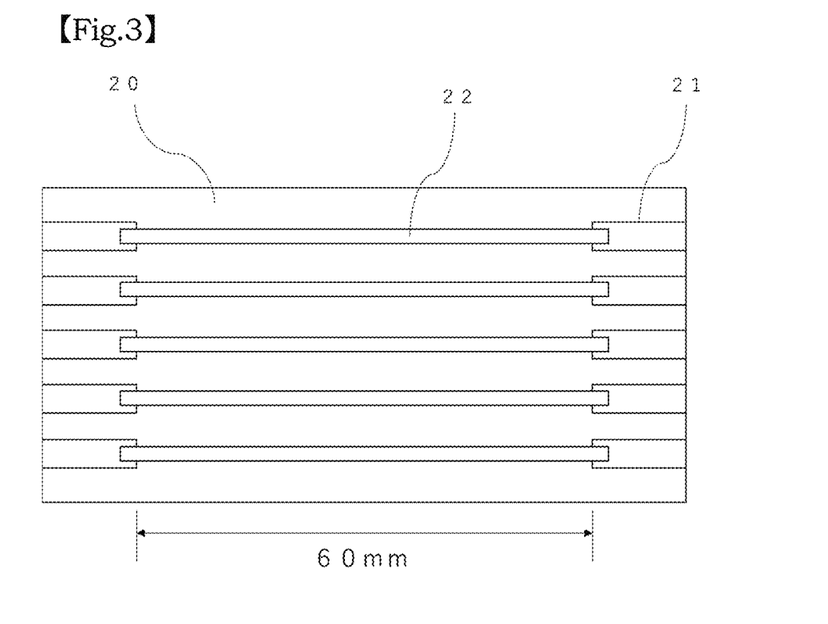
FIG. 3 is a plan view illustrating a substrate on which a sample of a cured material is formed, the sample being used in evaluation of conductivity of a conductive coating film.

The conductivity of each conductive coating film obtained from the conductive resin composition 1 and the conductive resin composition 2 was evaluated by a specific resistance. Specifically, as illustrated in FIG. 3, a polyimide film having a thickness of 55 μm on which a slit having a width of 5 mm was provided was pasted and masked on a glass epoxy substrate 20 on which electrode pads 21 containing a copper foil were provided on both ends at an interval of 60 mm, such that an end portion of the slit overlapped the electrode pads 21 on both ends. The conductive resin composition obtained in each of the examples and comparative examples was sprayed and applied thereon by using a spray device (SL-940E: manufactured by Nordson ASYMTEK).

The conductive resin composition was heated at 190° C. for 30 minutes to be cured, the polyimide film was peeled off, and thus, the substrate 20 was obtained on which a cured material 22 having a length of 70 mm, a width of 5 mm, and a thickness of approximately 20 μm was formed to connect between the electrode pads 21 on both ends. In such a cured material sample, a resistance value (Ω) between the electrode pads was measured by using a tester, and a specific resistance (Ω·cm) was calculated by Expression (1) described below, from a sectional area (S, cm$^2$) and the length (L, cm).

[Expression 1]

$$\text{Specific Resistance} = \frac{S}{L} \times R \quad (1)$$

In the sectional area, the length, and the specific resistance of the sample, five cured material samples were formed on three glass epoxy substrates (a total of 15 cured material samples), and average values thereof were obtained. Note that, in a case where the specific resistance is 5×10$^{-5}$ Ω·cm or less, the cured material sample can preferably be used as a shield layer for blocking the electromagnetic wave in the low-frequency region, of the band of 10 MHZ.

(2) Cohesiveness of Conductive Coating Film

Each of the conductive resin compositions obtained as described above was left to stand at a room temperature (25° C.) for 1 week, and the cohesiveness between the shield layer and the package surface or the ground circuit was evaluated on the basis of JIS K 5600-5-6:1999 (a crosscut method).

Specifically, a copper-clad laminate for evaluating the cohesiveness with respect to the ground circuit was prepared, and a resin plate (50 mm×50 mm×2 mm) containing a cured material of a mold resin prepared by an epoxy resin and silica particles (CV8710, manufactured by Panasonic Corporation) in which the surface was not subjected to a plasma treatment was prepared in order to evaluate the cohesiveness with respect to the package surface. Each of the laminate and the plate was masked with polyimide tape to form an opening portion having a width of 5 cm and a length of 10 cm, the conductive resin composition 1 was sprayed and applied by using a spray coating device SL-940E (manufactured by Nordson ASYMTEK), and then, was heated at 190° C. for 10 minutes to be cured, and thus, a first coating film having a thickness of approximately 10 μm was formed. After that, similarly, the conductive resin composition 2 was sprayed and applied, and was heated at 190° C. for 30 minutes to be cured, and thus, a second coating film was formed, and the polyimide tape was peeled off and thus, a two-layered coating film having a thickness of approximately 35 μm was formed. The crosscut test was performed on the copper foil and the mold resin on which the coating film was formed. The crosscut test was performed with respect to a coating film before reflow, a coating film that was subjected to a reflow treatment at the highest temperature of 260° C. for 10 seconds three times, and a coating film that was repeatedly subjected to a heat cycle test 1000 times in which the coating film was exposed to a condition of −65° C. for 30 minutes, and then was exposed to a condition of 125° C. for 30 minutes. Note that, in the heat cycle test, a coating film that was not subjected to the reflow treatment was used.

The evaluation of the cohesiveness was performed on the basis of the following criteria.

0: The edge of the cut is completely smooth, and there is no peeling of the reticulation in any grid.

1: The coating film is slightly peeled off at an intersection of the cuts. The coating film affected in a crosscut portion is obviously not greater than 5%.

2: The coating film is peeled off along the edge of the cut and/or at the intersection. The coating film affected in the crosscut portion is obviously greater than 5% but not greater than 15%.

3: The coating film is partially or wholly peeled off along the edge of the cut and/or various portions of the reticulations are partially or wholly peeled off. The coating film affected in the crosscut portion is obviously greater than 15% but not greater than 35%.

4: The coating film is partially or wholly peeled off along the edge of the cut and/or several reticulations are partially or wholly peeled off. The coating film affected in the crosscut portion is obviously not greater than 35%.

5: Any of the peeling grades that is not capable of being classified in Grade 4.

(Note that, peeling between the first coating film and the second coating film was also evaluated as the peeling in the criteria described above.)

(3) Shielding Effect (10 MHz)

The conductive resin composition 1 was sprayed and applied onto a polyimide film having a thickness of approximately 25 μm by using a spray coating device SL-940E (manufactured by Nordson ASYMTEK), and then, was heated at 190° C. for 10 minutes to be cured, and thus, a first coating film having a thickness of approximately 10 μm was formed. After that, similarly, the conductive resin composition 2 was sprayed and applied, and was heated at 190° C. for 30 minutes to be cured, and thus, a second coating film was formed, and the polyimide tape was peeled of, and thus, a two-layered coating film having a thickness of approximately 35 μm was formed, and was cut to be 15 cm in all directions, and thus, a sample was obtained. A shielding effect of the obtained sample was evaluated by a KEC method. A measurement condition was an atmosphere in which a temperature was 25° C. and relative humidity was 30% to 50%.

Figure 4:
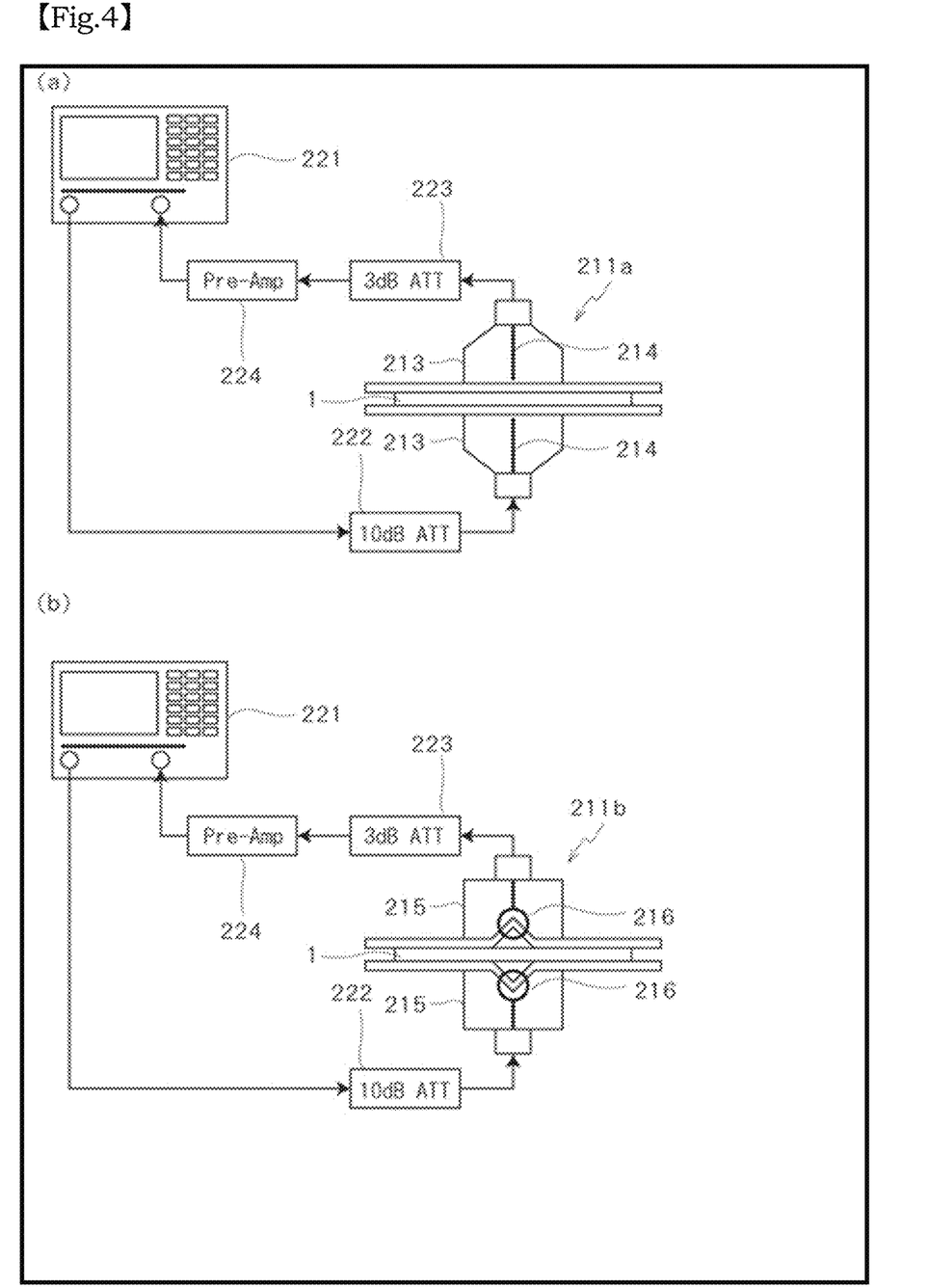
FIG. 4 is a schematic view illustrating a configuration of a system that is used in evaluation of a shielding effect of the conductive coating film.

FIG. 4 is a schematic view illustrating the configuration of a system that is used in the KEC method. The system that is used in the KEC method includes electromagnetic wave shielding effect measurement devices 211a and 211b, a spectrum analyzer 221, an attenuator 222 performing attenuation of 10 dB, an attenuator 223 performing attenuation of 3 dB, and a pre-amplifier 224.

Note that, U3741 manufactured by ADVANTEST CORPORATION was used in the spectrum analyzer 221. In addition, HP8447F manufactured by Agilent Technologies, Inc. was used in the pre-amplifier.

As illustrated in FIG. 4, different tools (measurement tools 213 and 215) are respectively used in the measurement of an electric field wave shielding effect and the measurement of a magnetic field wave shielding effect. FIG. 4(a) illustrates the electric field wave shielding effect evaluation device 211a, and FIG. 4(b) illustrates the magnetic field wave shielding effect evaluation device 211b.

In the electric field wave shielding effect evaluation device 211a, two measurement tools 213 are provided to face each other. The sample that is a measurement target is provided by being interposed between the measurement tools 213 and 213. A dimensional distribution of a transverseelectro magnetic cell (TEM cell) is adopted in the measurement tool 213, and the measurement tool 213 has a structure that is divided symmetrically in the plane perpendicular to a transmission axis direction. Here, in order to prevent a short-circuit due to the insertion of the sample, a plate-like central conductor 214 is disposed with a gap with respect to each of the measurement tools 213.

In addition, in the electric field wave shielding effect evaluation device 211b, two measurement tools 215 are provided to face each other. The sample that is a measurement target is provided by being interposed between the measurement tools 215 and 215. In the magnetic field wave shielding effect evaluation device 211b, in order to generate an electromagnetic field having a large magnetic field wave component, a shield type circular loop antenna 216 is used in the measurement tool 215, and is combined with a metal plate of 90 angles, and thus, a quarter of the loop antenna is exposed to the outside.

In the KEC method, first, a signal that is output from the spectrum analyzer 221 is input into the measurement tool 213 or the measurement tool 215 on a transmission side through the attenuator 222. Then, the signal that is received in the measurement tool 213 or the measurement tool 215 on a reception side is amplified by the pre-amplifier 224 through the attenuator 223, and then, a signal level is measured by the spectrum analyzer 221. Note that, the spectrum analyzer 221 outputs an attenuation amount in a case where the sample is provided in the electromagnetic wave shielding effect measurement devices 211a and 211b, on the basis of a state where the sample is not provided in the electromagnetic wave shielding effect measurement devices 211a and 211b.

In the evaluation of the shielding effect, in a case where an attenuation amount at 10 MHz was 25 dB or more, it was determined that the shielding effect was excellent. Note that, it can be evaluated that the attenuation amount of the sample tends to increase as an electromagnetic wave is a radio-frequency wave, and in a case where an excellent shielding effect is obtained with respect to an electromagnetic wave at 10 MHz, an excellent shielding effect is also obtained with respect to an electromagnetic wave at 1000 MHZ.

TABLE 1

| | | | | Example | | | | | | | |
|---|---|---|---|---|---|---|---|---|---|---|---|
| | | | | 1 | 2 | 3 | 4 | 5 | 6 | 7 | 8 |
| First layer | Binder component (A) | Solid epoxy resin | | 15 | 15 | 15 | 15 | 15 | 15 | 15 | 15 |
| | | Liquid epoxy resin | | 35 | 35 | 35 | 35 | 35 | 35 | 35 | 35 |
| | | Items | Glycidyl amine type epoxy resin | 10 | 10 | 10 | 10 | 10 | 10 | 10 | 10 |
| | | | Glycidyl ether type epoxy resin | 25 | 25 | 25 | 25 | 25 | 25 | 25 | 25 |
| | Monomer (A) | | | 50 | 50 | 50 | 50 | 50 | 50 | 50 | 50 |
| | Metal particles (B1) spherical reduced powder | | | 675 | 450 | 225 | 850 | 137.5 | 450 | 450 | 450 |
| | Metal particles (B2) flaky particles | | | 225 | 450 | 675 | 850 | 412.5 | 450 | 450 | 450 |
| | Curing agent (C1) | | | 5 | 5 | 5 | 5 | 5 | 5 | 5 | 5 |
| | Curing agent (C2) | | | 15 | 15 | 15 | 15 | 15 | 15 | 15 | 15 |
| | Solvent | | | 280 | 280 | 280 | 570 | 160 | 280 | 280 | 280 |
| | B1/(B1 + B2) | | | 75 | 50 | 25 | 50 | 25 | 50 | 50 | 50 |
| | B1 + B2 | | | 900 | 900 | 900 | 1700 | 550 | 900 | 900 | 900 |
| | Conductivity of conductive coating film (specific resistance, $\times 10^{-5}$ $\Omega \cdot$ cm) | | | 9.5 | 8.1 | 8.1 | 7.9 | 11.5 | 8.1 | 8.1 | 8.1 |
| Second layer | Binder component | (Meth)acrylic resin (D1) | | 37 | 37 | 37 | 37 | 37 | 37 | 1 | 66 |
| | | (Meth)acrylic resin (D2) | | — | — | — | — | — | — | — | — |
| | | (Meth)acrylic resin (D3) | | — | — | — | — | — | — | — | — |
| | Monomer (E1) | | | 63 | 63 | 63 | 63 | 63 | 63 | 99 | 34 |
| | Monomer (E2) | | | — | — | — | — | — | — | — | — |
| | Monomer (E3) | | | — | — | — | — | — | — | — | — |

TABLE 1-continued

|  |  |  |  |  |  |  |  |  |  |  |
|---|---|---|---|---|---|---|---|---|---|---|
|  |  | Metal particles (F) | 3750 | 3750 | 3750 | 3750 | 3750 | 3750 | 600 | 5000 |
|  |  | Metal particles (G) | 22500 | 22500 | 22500 | 22500 | 22500 | 22500 | 1430 | 30000 |
|  |  | Radical polymerization initiator (H) | 5 | 5 | 5 | 5 | 5 | 5 | 5 | 5 |
|  |  | Solvent | 6563 | 6563 | 6563 | 6563 | 6563 | 6563 | 508 | 8750 |
|  |  | F1(F + G) | 14 | 14 | 14 | 14 | 14 | 14 | 30 | 14 |
|  |  | F + G | 26250 | 26250 | 26250 | 26250 | 26250 | 26250 | 2030 | 35000 |
|  |  | Conductivity of conductive coating film (specific resistance, ×10$^{-5}$ Ω·cm) | 0.73 | 0.73 | 0.73 | 0.73 | 0.73 | 0.73 | 3.2 | 0.67 |
| Cohesiveness of conductive coating film | Copper-clad laminate | Before reflow | 0 | 0 | 0 | 0 | 0 | 0 | 0 | 0 |
|  |  | After reflow | 0 | 0 | 0 | 0 | 0 | 0 | 0 | 0 |
|  |  | After heat cycle test | 0 | 0 | 0 | 0 | 0 | 0 | 0 | 1 |
| Cohesiveness of conductive coating film | Mold resin | Before reflow | 0 | 0 | 0 | 0 | 0 | 0 | 0 | 0 |
|  |  | After reflow | 0 | 0 | 0 | 0 | 0 | 0 | 0 | 0 |
|  |  | After heat cycle test | 0 | 0 | 0 | 0 | 0 | 0 | 0 | 1 |
|  |  | Shielding effect (10 MHz) | 39 | 40 | 42 | 43 | 39 | 45 | 31 | 47 |

|  |  |  |  | Example |  |  |  |  |  |  |  |
|---|---|---|---|---|---|---|---|---|---|---|---|
|  |  |  |  | 9 | 10 | 11 | 12 | 13 | 14 | 15 | 16 |
| First layer | Binder component (A) | Solid epoxy resin |  | 15 | 15 | 15 | 15 | 15 | 15 | 15 | 15 |
|  |  | Liquid epoxy resin |  | 35 | 35 | 35 | 35 | 35 | 35 | 35 | 35 |
|  |  | Items | Glycidyl amine type epoxy resin | 10 | 10 | 10 | 10 | 10 | 10 | 10 | 10 |
|  |  |  | Glycidyl ether type epoxy resin | 25 | 25 | 25 | 25 | 25 | 25 | 25 | 25 |
|  |  | Monomer (A) |  | 50 | 50 | 50 | 50 | 50 | 50 | 50 | 50 |
|  | Metal particles (B1) spherical reduced powder |  |  | 450 | 450 | 450 | 450 | 450 | 450 | 450 | 450 |
|  | Metal particles (B2) flaky particles |  |  | 450 | 450 | 450 | 450 | 450 | 450 | 450 | 450 |
|  | Curing agent (C1) |  |  | 5 | 5 | 5 | 5 | 5 | 5 | 5 | 5 |
|  | Curing agent (C2) |  |  | 15 | 15 | 15 | 15 | 15 | 15 | 15 | 15 |
|  | Solvent |  |  | 280 | 280 | 280 | 280 | 280 | 280 | 280 | 280 |
|  | B1/(B1 + B2) |  |  | 50 | 50 | 50 | 50 | 50 | 50 | 50 | 50 |
|  | B1 + B2 |  |  | 900 | 900 | 900 | 900 | 900 | 900 | 900 | 900 |
|  | Conductivity of conductive coating film (specific resistance, ×10$^{-5}$ Ω·cm) |  |  | 8.1 | 8.1 | 8.1 | 8.1 | 8.1 | 8.1 | 8.1 | 8.1 |
| Second layer | Binder component | (Meth)acrylic resin (D1) |  | 37 | 37 | 50 | 37 | — | — | 37 | 37 |
|  |  | (Meth)acrylic resin (D2) |  | — | — | — | — | — | 37 | — | — |
|  |  | (Meth)acrylic resin (D3) |  | — | — | 37 | — | — | — | — | — |
|  |  | Monomer (E1) |  | 63 | 63 | 50 | 63 | 63 | 63 | — | — |
|  |  | Monomer (E2) |  | — | — | — | — | — | — | 63 | — |
|  |  | Monomer (E3) |  | — | — | — | — | — | — | — | 63 |
|  | Metal particles (F) |  |  | 3750 | 3750 | 2500 | 2500 | 3750 | 3750 | 3750 | 3750 |
|  | Metal particles (G) |  |  | 22500 | 22500 | 500 | 25000 | 22500 | 22500 | 22500 | 22500 |
|  | Radical polymerization initiator (H) |  |  | 0.5 | 35 | 5 | 5 | 5 | 5 | 5 | 5 |
|  | Solvent |  |  | 6563 | 6563 | 775 | 6900 | 6563 | 6563 | 6563 | 6563 |
|  | F1(F + G) |  |  | 14 | 14 | 83 | 9 | 14 | 14 | 14 | 14 |
|  | F + G |  |  | 26250 | 26250 | 3000 | 27500 | 26250 | 26250 | 26250 | 26250 |
|  | Conductivity of conductive coating film (specific resistance, ×10$^{-5}$ Ω·cm) |  |  | 0.96 | 1.2 | 3.10 | 3.0 | 1.50 | 1.30 | 1.50 | 2.10 |
| Cohesiveness of conductive coating film | Copper-clad laminate | Before reflow |  | 0 | 0 | 0 | 0 | 0 | 0 | 0 | 0 |
|  |  | After reflow |  | 0 | 0 | 0 | 0 | 0 | 0 | 0 | 0 |
|  |  | After heat cycle test |  | 0 | 0 | 0 | 0 | 0 | 0 | 0 | 0 |
| Cohesiveness of conductive coating film | Mold resin | Before reflow |  | 0 | 0 | 0 | 0 | 0 | 0 | 0 | 0 |
|  |  | After reflow |  | 0 | 0 | 0 | 0 | 0 | 0 | 0 | 0 |

TABLE 1-continued

|  |  |  |  |  |  |  |  |  |
|---|---|---|---|---|---|---|---|---|
| After heat cycle test | 0 | 0 | 0 | 0 | 0 | 0 | 0 | 0 |
| Shielding effect (10 MHz) | 43 | 36 | 32 | 40 | 43 | 43 | 42 | 41 |

TABLE 2

|  |  |  | Comparative Example | | |
|---|---|---|---|---|---|
|  |  |  | 1 | 2 | 3 |
| First layer | Binder component (A) | Solid epoxy resin | — | 15 | 15 |
|  |  | Liquid epoxy resin | — | 35 | 35 |
|  |  | Items Glycidyl amine type epoxy resin | — | 10 | 10 |
|  |  | Glycidyl ether type epoxy resin | — | 25 | 25 |
|  |  | Monomer (A) | — | 50 | 50 |
|  | Metal particles (B1) spherical reduced powder |  | — | 450 | 450 |
|  | Metal particles (B2) flaky particles |  | — | 450 | 450 |
|  | Curing agent (C1) |  | — | 5 | 5 |
|  | Curing agent (C2) |  | — | 15 | 15 |
|  | Solvent |  | — | 280 | 280 |
|  | B1/(B1 + B2) |  | — | 50 | 50 |
|  | B1 + B2 |  | — | 900 | 900 |
|  | Conductivity of conductive coating film (specific resistance, $\times 10^{-5}$ Ω·cm) |  | — | 8.1 | 8.1 |
| Second layer | Binder component | (Meth)acrylic resin (D1) | 37 | 1 | 66 |
|  |  | (Meth)acrylic resin (D2) | — | — | — |
|  |  | (Meth)adylic resin (D3) | — | — | — |
|  |  | Monomer (E1) | 63 | 99 | 34 |
|  |  | Monomer (E2) | — | — | — |
|  |  | Monomer (E3) | — | — | — |
|  | Metal particles (F) |  | 3750 | 100 | 6000 |
|  | Metal particles (G) |  | 22500 | 1800 | 75000 |
|  | Radical polymerization initiator (H) |  | 5 | 5 | 5 |
|  | Solvent |  | 6563 | 475 | 20250 |
|  | F1(F + G) |  | 14 | 5 | 7 |
|  | F + G |  | 26250 | 1900 | 81000 |
|  | Conductivity of conductive coating film (specific resistance, $\times 10^{-5}$ Ω·cm) |  | 0.73 | 5.5 | 0.65 |
| Cohesiveness of conductive coating film | Copper-clad laminate | Before reflow | 0 | 0 | 5 |
|  |  | After reflow | 0 | 0 | 5 |
|  |  | After heat cycle test | 1 | 0 | 5 |
| Cohesiveness of conductive coating film | Mold resin | Before reflow | 0 | 0 | 5 |
|  |  | After reflow | 0 | 0 | 5 |
|  |  | After heat cycle test | 3 | 0 | 5 |
| Shielding effect (10 MHz) |  |  | 40 | 23 | 45 |

From the results shown in Tables 1 and 2, it was found that any of the coating films of the second layers by the conductive resin compositions 2 of each of the examples had excellent conductivity and also had excellent shielding properties with respect to the electromagnetic wave in the low-frequency region of the band of 10 MHZ. In addition, it was found that any of the coating film before the reflow, the coating film after the reflow, and the coating film after the heat cycle test was also excellent in the cohesiveness between the shield layer and the package surface or the ground circuit.

In Comparative Example 1, an example is described in which the conductive resin composition 2 was directly applied onto the mold resin, and the cohesiveness with respect to the mold resin after the heat cycle test, that is, the cohesiveness with respect to the package surface deteriorated.

In Comparative Example 2, an example is described in which a total content of the metal particles (F) and the metal particles (G) of the conductive resin composition 2 was less than a predetermined value, and the conductivity of the conductive coating film was low, and the shielding effect deteriorated.

In Comparative Example 3, an example is described in which a total content of the metal particles (F) and the metal particles (G) of the conductive resin composition 2 was greater than a predetermined value, and in any of the coating film before the reflow, the coating film after the reflow, and the coating film after the heat cycle test, the cohesiveness between the shield layer and the package surface and the ground circuit deteriorated.

The invention claimed is:

1. A shield package, comprising:
   a package in which an electronic component is mounted on a substrate, and the electronic component is sealed with a sealing material; and
   a shield layer including a first layer and a second layer that are sequentially laminated on the package,
   wherein the first layer made from a conductive resin composition in which (A) 100 parts by mass of a binder component containing 5 parts by mass to 30 parts by mass of a solid epoxy resin that is a solid at a normal temperature and 20 parts by mass to 90 parts by mass of a liquid epoxy resin that is a liquid at a normal temperature in a range not exceeding a total amount of 100 parts by mass, (B) 400 parts by mass to 1800 parts by mass of metal particles, and (C) 0.3 part by mass to 40 parts by mass of a curing agent are contained, the metal particles (B) include at least (B1) spherical metal particles and (B2) flaky metal particles, and a content ratio of the spherical metal particles (B1) to the metal particles (B) is 20 mass % to 80 mass %, the second layer made from a conductive resin composition in which a binder component containing (D) a (meth)acrylic resin having a weight average molecular weight of 1000 or more and 400000 or less and (E) a monomer having a glycidyl group and/or a (meth)acryloyl group in molecules, (F) metal particles having an average particle diameter of 10 nm to 500 nm, (G) metal particles having an average particle diameter of 1 μm to 50 μm, and (H) a radical polymerization initiator are contained, a total content of the metal particles (F) and the metal particles (G) is 2000 parts by mass to 80000 parts by mass with respect to 100 parts by mass of the binder component of the second layer, and a content ratio of the metal particles (F) to a total amount of the metal particles (F) and the metal particles (G) is 8 mass % to 85 mass %.

2. The shield package according to claim 1, wherein the binder component (A) further contains a monomer having a (meth)acryloyl group in molecules.

3. The shield package according to claim 1, wherein the monomer (E) is a monomer having a glycidyl group and a (meth)acryloyl group in molecules.

4. The shield package according to claim 1, wherein the metal particles (G) are at least one type selected from the group consisting of copper particles, silver-coated copper particles, and silver-coated copper alloy particles.

5. The shield package according to claim 2, wherein the monomer (E) is a monomer having a glycidyl group and a (meth)acryloyl group in molecules.

6. The shield package according to claim 2, wherein the metal particles (G) are at least one type selected from the group consisting of copper particles, silver-coated copper particles, and silver-coated copper alloy particles.

7. The shield package according to claim 3, wherein the metal particles (G) are at least one type selected from the group consisting of copper particles, silver-coated copper particles, and silver-coated copper alloy particles.

* * * * *